(12) United States Patent
Brun et al.

(10) Patent No.: US 9,793,151 B2
(45) Date of Patent: Oct. 17, 2017

(54) STIFFENER TAPE FOR ELECTRONIC ASSEMBLY

(71) Applicant: Intel Corporation, Santa Clara, CA (US)

(72) Inventors: Xavier Brun, Chandler, AZ (US); Arjun Krishnan, Chandler, AZ (US); Mohit Mamodia, Chandler, AZ (US); Dingying Xu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/568,552

(22) Filed: Dec. 12, 2014

(65) Prior Publication Data
US 2016/0172229 A1    Jun. 16, 2016

(51) Int. Cl.
| | |
|---|---|
| *H01L 21/683* | (2006.01) |
| *H01L 21/78* | (2006.01) |
| *H01L 21/304* | (2006.01) |
| *H01L 23/00* | (2006.01) |

(52) U.S. Cl.
CPC ........ *H01L 21/6836* (2013.01); *H01L 21/304* (2013.01); *H01L 21/78* (2013.01); *H01L 23/562* (2013.01); *H01L 2221/6834* (2013.01); *H01L 2221/68327* (2013.01); *H01L 2221/68331* (2013.01); *H01L 2221/68377* (2013.01); *H01L 2924/0002* (2013.01)

(58) Field of Classification Search
USPC .......... 257/707; 438/464; 428/614, 344, 622
See application file for complete search history.

(56) References Cited

U.S. PATENT DOCUMENTS

2001/0051395 A1* 12/2001 Grigg ................. G03F 7/70416
                                                                438/107
2011/0156277 A1*  6/2011 Takamoto .......... H01L 21/6836
                                                                257/778

(Continued)

FOREIGN PATENT DOCUMENTS

TW           201206813 A      2/2012

OTHER PUBLICATIONS

"Taiwanese Application Serial No. 104134227, Office Action mailed Aug. 22, 2016", w/ English Claims, 9 pgs.

(Continued)

*Primary Examiner* — Marcos D Pizarro
*Assistant Examiner* — Lawrence Tynes, Jr.
(74) *Attorney, Agent, or Firm* — Schwegman Lundberg & Woessner, P.A.

(57) ABSTRACT

Some example forms relate to a stiffener tape for a wafer. The stiffener tape includes a mounting tape and a stiffener removably attached to the mounting tape. The stiffener tape further includes a die attach film attached to the stiffener. Other example forms relate to an electronic assembly that includes a wafer and a stiffener tape attached to the wafer. The stiffener tape includes a die attach film mounted to the wafer. A stiffener is attached to the die attach film and a mounting tape is removably attached to the stiffener. Still other example forms relate to a method that includes forming a stiffener tape which includes a mounting tape, a stiffener removably attached to the mounting tape and a die attach film attached to the stiffener.

16 Claims, 5 Drawing Sheets

(56) References Cited

U.S. PATENT DOCUMENTS

| | | | |
|---|---|---|---|
| 2011/0189835 A1* | 8/2011 | Sugo | B32B 7/12 |
| | | | 438/464 |
| 2013/0249079 A1* | 9/2013 | Lee | H01L 29/0657 |
| | | | 257/737 |
| 2015/0084213 A1* | 3/2015 | Heng | H01L 24/19 |
| | | | 257/787 |

OTHER PUBLICATIONS

"Taiwanese Application Serial No. 104134227, Response filed Feb. 23, 2017 to Office Action mailed Aug. 22, 2016", w/ claims in English, 15 pgs.

\* cited by examiner

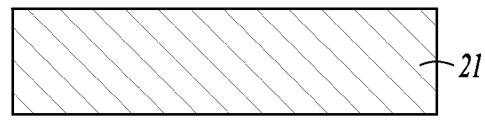
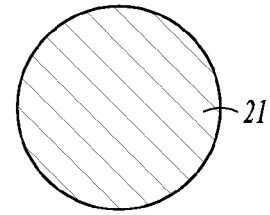
FIG. 3  FIG. 4
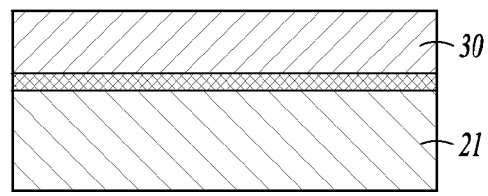
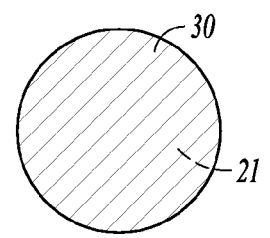
FIG. 5  FIG. 6
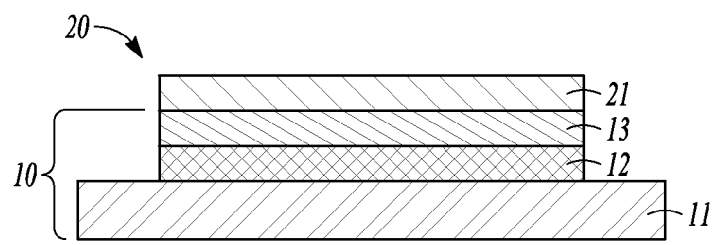
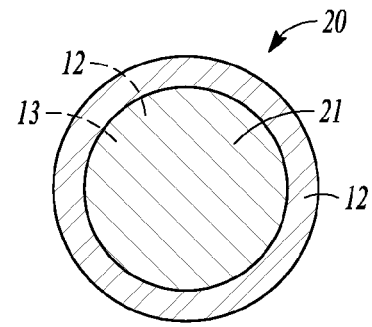
FIG. 7  FIG. 8

STIFFENER TAPE FOR ELECTRONIC ASSEMBLY

TECHNICAL FIELD

Embodiments described herein generally relate to a stiffener tape, and more particularly to a stiffener tape for an electronic assembly.

BACKGROUND

One of the drawbacks with conventional electronic assemblies that include ultra-thin silicon dies mounted onto the substrates is warpage. This warpage is due to differences in the coefficients of thermal expansion (CTE) between the ultra-thin silicon dies and the substrates.

There presently does not exist a low cost and manufacturable solution for ultra-thin die (<100 um) warpage control. Therefore, a need exists for an electronic assembly that includes an ultra-thin silicon die mounted onto a substrate where the electronic assembly (i) has reduced warpage due to CTE mismatch at room temperature and reflow temperatures; and (ii) does not require any specialized manufacturing equipment in order to fabricate the electronic assembly.

BRIEF DESCRIPTION OF THE DRAWINGS

FIG. 3 illustrates a side view of an example wafer.

FIG. 4 illustrates a top view of wafer shown in FIG. 3.

FIG. 5 illustrates the example wafer of FIG. 3 after a grinding tape has been mounted to the wafer and the wafer has been thinned by grinding.

FIG. 6 is a top view of the example wafer shown in FIG. 5.

FIG. 7 illustrates the example wafer of FIG. 5 after the grinding tape has been removed and the stiffener tape of FIG. 1 has been applied to the wafer.

FIG. 8 is a top view of the example wafer and stiffener tape shown in FIG. 7.

DESCRIPTION OF EMBODIMENTS

Figure 1:
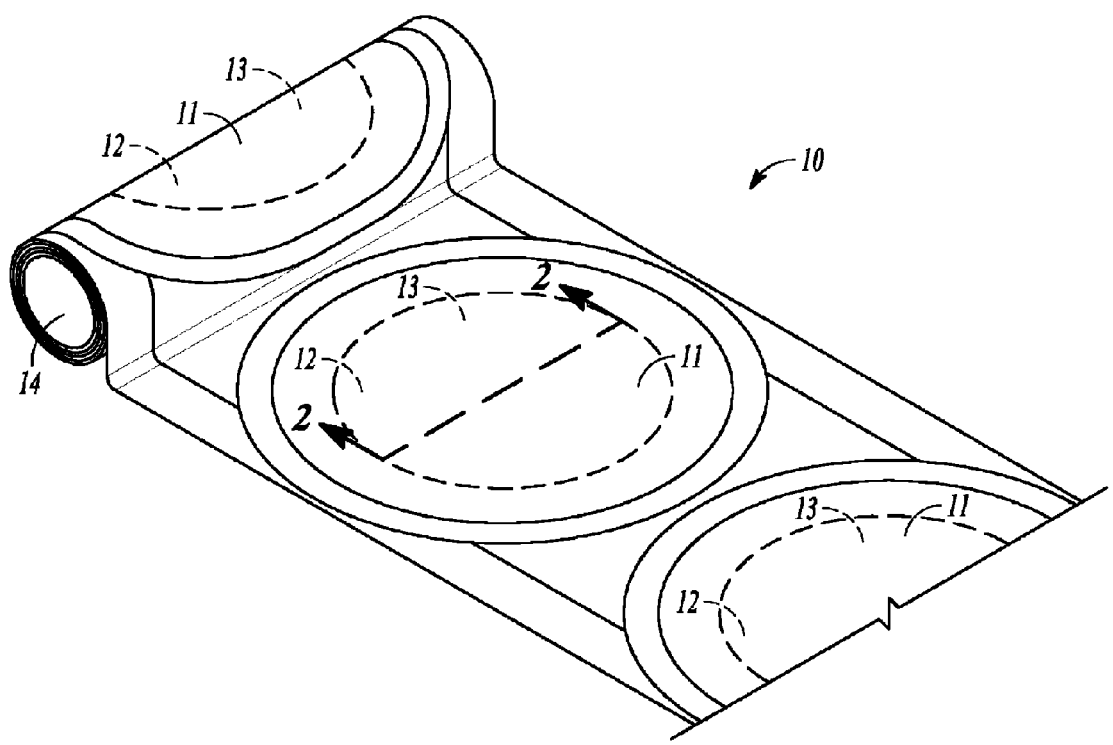
FIG. 1 illustrates an example an example stiffener tape for a wafer wherein the stiffener tape is partially unrolled.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the electrical interconnect or electronic package.

Some example forms relate to a stiffener tape for a wafer level stiffener application. The stiffener tape provides a low cost and manufacturable solution for ultra-thin die (<100 um) warpage control at both room temperature and reflow temperatures by integrating a stiffener at the wafer level in a die preparation process. In addition, the using the stiffener tape may reduce the need for any specialized equipment when fabricating electronic assemblies that include ultra-thin dies.

In some forms, a thin metal/polymer film (e.g., stainless steel with adhesive) may be attached to a die using a thermosetting adhesive at wafer level. The high strength of the stiffener along with CTE of the metal thin metal/polymer film balances the CTE mismatch between the dies and a substrate that the die is eventually mounted on.

In addition, existing lamination processes may be used to attach the stiffener tape at a wafer level. The example wafer may also eventually be singulated using conventional die singulation processes (e.g., by sawing).

Compared to conventional techniques (e.g., using a single unit level stiffener), the stiffener tapes, methods and electronic assemblies described herein may provide a manufacturable low cost solution by applying a stiff stainless steel layer at wafer level. Applying a stiff stainless steel layer at wafer level may provide good geometry control of the die and placement accuracy. In addition, the stiffener tapes, methods and electronic assemblies described herein may (i) provide improved thin wafer picking from dicing tape; and (ii) reduce the risk of damaging ultra-thin wafers during fabrication of electronic assemblies that include ultra-thin wafers.

Below are some example material properties for the stiffener tape:

|  | Property | Target |
| --- | --- | --- |
| Metal/Polymer Film | Material Type | SUS, Cu, Al, LCP |
|  | Thickness | 5-100 um |
|  | Modulus | >70 GPa |
|  | CTE (20 C.) | >15 ppm |
|  | CTE (250 C.) | >15 ppm |
| DAF/DBF | Thickness | 5-50 um |
|  | Post cure modulus | 1-20 GPa |
|  | Pre-cure modulus | >0.1 GPa |
|  | Fillers | Silica, Alumina, other fillers or no fillers |
|  | ESD functionality | E5-E15 |
|  | CTE-1 (25 C.) | >10 ppm |
|  | CTE-2 (100-150 C.) | >40 ppm |
|  | Tg | >50 C. |
|  | Thermal stability | <0.5% loss at 260 C. |
|  | Chemistry | Epoxy, acrylic, polyimide, silicones with crosslinkers and toughening agents |

In some forms, the stiffener tape may be a ~10-100 um high strength metal/polymer film. In addition, increased adhesion may be achieved at the metal/adhesive interface when a surface treatment is utilized (e.g., SILANE).

Figure 2:
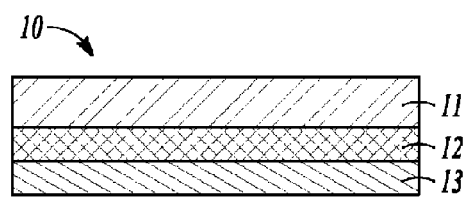
FIG. 2 illustrates the stiffener tape of FIG. 1 taken along line 2-2.

FIG. 1 illustrates an example an example stiffener tape 10 for a wafer wherein the stiffener tape 10 is partially unrolled. FIG. 2 illustrates the stiffener tape 10 of FIG. 1 taken along line 2-2. The stiffener tape 10 includes a mounting tape 11 and a stiffener 12 removably attached to the mounting tape 11. The stiffener tape 10 further includes a die attach film 13 attached to the stiffener 12. As an example, the mounting tape may be approximately 380-420 mm and the die attach film may be approximately 300-330 mm. In addition the stiffener may be approximately 300-330 mm.

In some example forms, the mounting tape 11 is a polymer film, although other materials that are known now, or discovered in the future, are contemplated. In one form, the mounting tape 11 includes polyolefins such as polypropylene, polyethylene, polylvinylchloride (PVC), polyethylene terephthalate (PET), polystyrene, polyurethane. A composite film of multiple such polymers may also be utilized. In another form, the mounting tape 11 is formed as a laminate that is made of layers of different materials (e.g., various polyolefins such as polypropylene, polyethylene, polylvinylchloride (PVC), polyethylene terephthalate (PET), polystyrene, polyurethane).

In some example forms, the die attach film 13 is an adhesive although other materials that are known now, or discovered in the future, are contemplated. In one form, the die attach film 13 includes epoxy resin. In another form, the die attach film 13 includes acrylic. In another form, the die attach film 13 includes polyimide. In another form, the die attach film 13 includes silicone based on crosslinking and toughening agents. In another form, the stiffener 12 is formed as a laminate that is made of layers of different materials (e.g., epoxy resin, acrylic, polyimide or silicone based on crosslinking and toughening agents).

In some example forms, the stiffener 12 is a metal foil although other materials that are known now, or discovered in the future, are contemplated. "In one form, the stiffener 12 includes a stainless steel material. In another form, the stiffener 12 includes a copper material. In another form, the stiffener 12 includes an aluminum material. In another form, the stiffener 12 includes at least one liquid crystal polymers. In another form, the stiffener 12 is formed as a laminate that is made of layers of different materials (e.g., stainless steel, copper, aluminum or liquid crystal polymers).

In addition, the size of the stiffener 12 may match a size of the wafer that the stiffener tape 10 is eventually attached in order to provide mechanical and thermal support to the wafer and any electronic assemblies that may include the wafer and the stiffener tape 10. The size of the stiffener 12 will depend in part on the overall design of the electronic assemblies as well as manufacturing considerations that are associated with attaching the stiffener tape 10 to a wafer (among other factors).

As shown in FIG. 1, the mounting tape 11, the die attach film 13 and multiple stiffeners 12 are formed into a roll 14 that may be unrolled to expose individual stiffeners 12. Individual stiffeners 12, mounting tapes 11 and die attach films 13 may be removed from the roll 14 for subsequent attachment to a wafer. It should be noted that the stiffeners 12, mounting tapes 11 and die attach films 13 may be in other forms besides a roll 14.

FIG. 7 shows an example electronic assembly 20 that includes an example stiffener tape 10 similar the stiffener tapes 10 described relative to FIGS. 1 and 2. The stiffener tape 10 in the illustrated example electronic assembly 20 is attached to a wafer 21. Other forms are contemplated where the wafer 21 is a substrate, board or some other type of base.

The stiffener tape 10 includes a die attach film 13 mounted to the wafer 21. The manner in which the stiffener tape 10 is mounted to the wafer 21 will depend in part on the types of materials that are used for the wafer 21 and the die attach film 13 (among other factors).

As an example, the wafer 21 may be formed of silicon and metal layers. The type of wafer 21 that is included in the electronic assembly 20 will depend in part on the application where the electronic assembly 20 is to be used (among other factors). In addition, the wafer 21 may be a relatively thin wafer 21 (e.g., less than 100 micron), and the stiffener tape 10 may be especially useful in providing thermal and/or mechanical support to a thin wafer 21.

Figure 11:
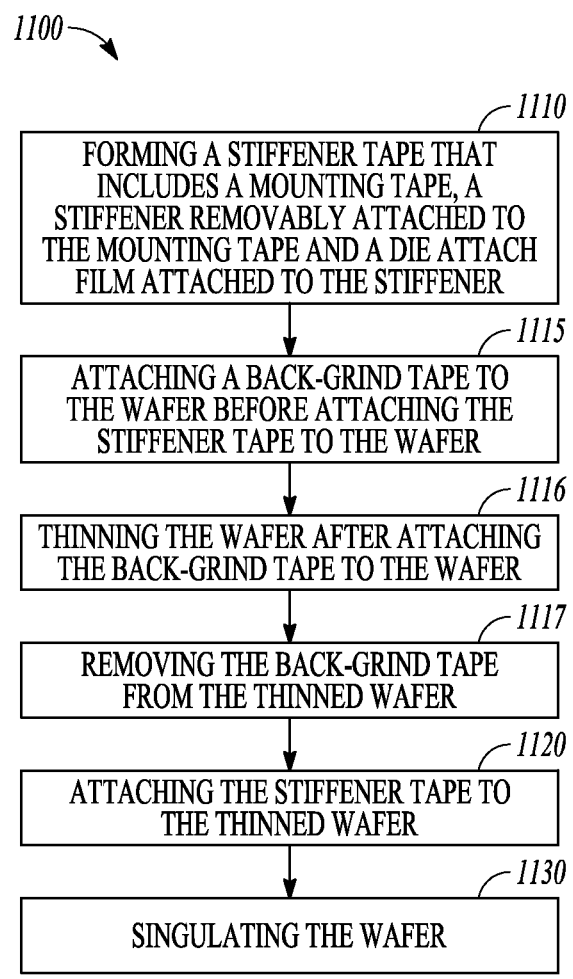
FIG. 11 is a flow diagram illustrating an example method of fabricating a stiffener tape and an electronic assembly that includes the stiffener tape.

FIG. 11 is a flow diagram illustrating an example method [1100] of fabricating a stiffener tape 10 and an electronic assembly 20 that includes the stiffener tape 10. The method [1100] includes [1110] forming a stiffener tape 10 that includes a mounting tape 11, a stiffener 12 removably attached to the mounting tape 11 and a die attach film 13 attached to the stiffener 12 (see e.g., FIG. 2).

In some forms, the method [1100] further includes [1120] attaching the stiffener tape 10 to a wafer 21 (see, e.g., FIGS. 7 and 8). It should be noted that although the die attach film 13 is shown as being used to attach the stiffener tape 10 to the wafer 21, other forms of attachment between the stiffener tape 10 and the wafer 21 are contemplated. As an example, a conventional inline thinning tool may be used to attach the stiffener tape 10 to the wafer 21.

FIG. 3 illustrates a side view of an example wafer 21. FIG. 4 illustrates a top view of wafer 21 shown in FIG. 3.

The method [1100] may further include [1115] attaching a back-grind tape 30 to the wafer 21 before [1120] attaching the stiffener tape 10 to the wafer 10; and [1116] thinning the wafer 21 after attaching the back-grind tape 30 to the wafer (see, e.g., FIGS. 5 and 6). In some forms, [1120] attaching the stiffener tape 10 to a wafer 21 may include attaching the stiffener tape 10 to the thinned wafer 21.

The method [1100] may further include [1117] removing the back-grind tape 30 from the thinned wafer 21 (see, e.g., FIGS. 5 and 6). The back-grind tape 30 may be removed from the thinned wafer 21 by any manner that is known now or discovered in the future.

Figure 9:
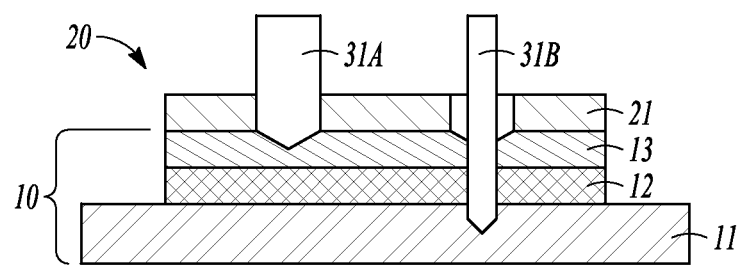
FIG. 9 illustrates a side view of the example wafer and stiffener tape shown in FIG. 7 being diced with two cutting blades.
Figure 10:
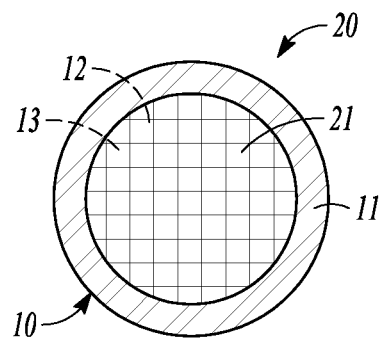
FIG. 10 is a top view of the example wafer and stiffener tape shown in FIG. 9.

In some forms, the method [1100] may further include [1130] singulating the thinned wafer 21 (see, e.g., FIGS. 9 and 10). The thinned wafer 21 may be singulated by any manner that is known now or discovered in the future. As an example, FIG. 9 illustrates a side view of the thinned wafer 21 and stiffener tape 10 shown in FIG. 7 being diced with two cutting blades 31A, 31B.

The stiffener tapes 10, methods [1100] and electronic assemblies 20 described herein may provide improved warpage control at both room temperature as well as higher temperature. This improved warpage control may enhance the yield of thin electronic assemblies for mobile products such as smartphones, tablets and wearables.

Figure 12:
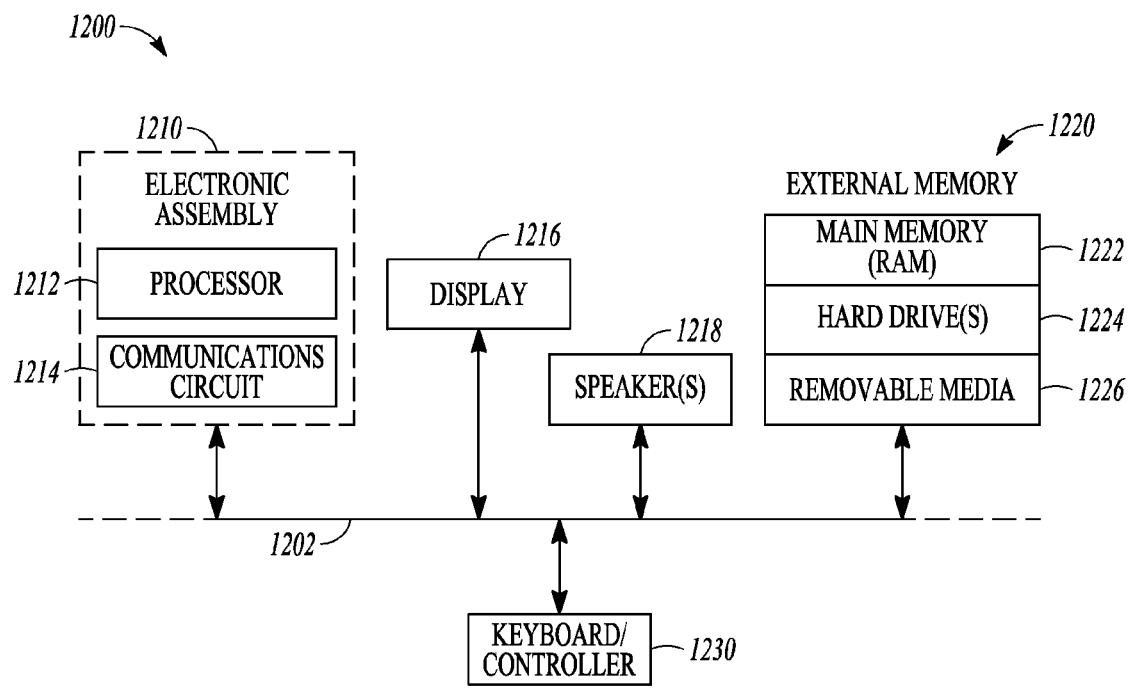
FIG. 12 is block diagram of an electronic apparatus that includes the stiffener tapes and/or electronic assemblies that include the stiffener tapes described herein.

FIG. 12 is a block diagram of an electronic apparatus 1200 incorporating at least one stiffener tape 10, method [1100] and electronic assembly 20 described herein. Electronic apparatus 1200 is merely one example of an electronic apparatus in which forms of the stiffener tapes 10, methods [1100] and electronic assemblies 20 described herein may be used.

Examples of an electronic apparatus 1200 include, but are not limited to, personal computers, tablet computers, mobile telephones, game devices, MP3 or other digital music players, etc. In this example, electronic apparatus 1200 comprises a data processing system that includes a system bus 1202 to couple the various components of the electronic apparatus 1200. System bus 1202 provides communications links among the various components of the electronic apparatus 1200 and may be implemented as a single bus, as a combination of busses, or in any other suitable manner.

An electronic assembly 1210 that includes any of the stiffener tapes 10, methods [1100] and electronic assemblies 20 as describe herein may be coupled to system bus 1202. The electronic assembly 1210 may include any circuit or combination of circuits. In one embodiment, the electronic assembly 1210 includes a processor 1212 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1210 are a custom circuit, an application-specific integrated circuit (ASIC), or the like, such as, for example, one or more circuits (such as a communications circuit 1214) for use in wireless devices like mobile telephones, tablet computers, laptop computers, two-way radios, and similar electronic systems. The IC can perform any other type of function.

The electronic apparatus 1200 may also include an external memory 1220, which in turn may include one or more memory elements suitable to the particular application, such as a main memory 1222 in the form of random access memory (RAM), one or more hard drives 1224, and/or one or more drives that handle removable media 1226 such as compact disks (CD), flash memory cards, digital video disk (DVD), and the like.

The electronic apparatus 1200 may also include a display device 1216, one or more speakers 1218, and a keyboard and/or controller 1230, which can include a mouse, trackball, touch screen, voice-recognition device, or any other device that permits a system user to input information into and receive information from the electronic apparatus 1200.

To better illustrate the method and apparatuses disclosed herein, a non-limiting list of embodiments is provided herein.

Example 1 includes a stiffener tape for a wafer. The stiffener tape includes a mounting tape and a stiffener removably attached to the mounting tape. The stiffener tape further includes a die attach film attached to the stiffener.

Example 2 includes the stiffener tape of example 1, wherein the mounting tape is a polymer film.

Example 3 includes the stiffener tape of any one of examples 1-2, wherein the die attach film is an adhesive.

Example 4 includes the stiffener tape of any one of examples 1-3, wherein the stiffener is a metal foil.

Example 5 includes the stiffener tape of any one of examples 1-4, wherein a size of the stiffener is larger than a size of the wafer.

Example 6 includes the stiffener tape of any one of examples 1-5, wherein the mounting tape, the die attach film and the stiffener are formed into a roll.

Example 7 includes an electronic assembly. The electronic assembly includes a wafer and a stiffener tape attached to the wafer. The stiffener tape includes a die attach film mounted to the wafer. The stiffener tape further includes a stiffener attached to the die attach film and a mounting tape removably attached to the stiffener.

Example 8 includes the electronic assembly of example 7, wherein the mounting tape is a polymer film.

Example 9 includes the electronic assembly of any one of examples 7-8, wherein the wafer is formed of silicon and metal layers.

Example 10 includes the electronic assembly of any one of examples 7-9, wherein the stiffener is a metal foil.

Example 11 includes the electronic assembly of any one of examples 7-10, wherein a size of the stiffener is larger than a size of the wafer.

Example 12 includes the electronic assembly of any one of examples 7-11, wherein the die attach film is an adhesive.

Example 13 includes a method that includes forming a stiffener tape that includes a mounting tape. A stiffener is removably attached to the mounting tape and a die attach film is attached to the stiffener.

Example 14 includes the method of example 13, and further including attaching the stiffener tape to the wafer.

Example 15 includes the method of any one of examples 13-14, and further including attaching a back-grind tape to the wafer before attaching the stiffener tape to the wafer.

Example 16 includes the method of any one of examples 13-15, and further including thinning the wafer after attaching the back-grind tape to the wafer.

Example 17 includes the method of any one of examples 13-16, wherein attaching the stiffener tape to the wafer includes attaching the stiffener tape to the thinned wafer.

Example 18 includes the method of any one of examples 13-17, and further including removing the back-grind tape from the thinned wafer.

Example 19 includes the method of any one of examples 13-18, and further including singulating the wafer.

Example 20 includes the method of any one of examples 13-19, wherein singulating the wafer includes dicing the wafer with two cutting blades.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A stiffener tape for a wafer, the stiffener tape comprising:
   a mounting tape;
   a metallic stiffener removably attached to the mounting tape; and
   a die attach film attached to the stiffener, wherein the mounting tape, the die attach film and the metallic stiffener are formed into a roll and the metallic stiffener is between the mounting tape and the die attach film.

2. The stiffener tape of claim 1, wherein the mounting tape is a polymer film.

3. The stiffener tape of claim 1, wherein the die attach film is an adhesive.

4. The stiffener tape of claim 1, wherein the metallic stiffener is a metal foil.

5. The stiffener tape of claim 1, wherein a size of the metallic stiffener is larger than a size of the wafer.

6. A method comprising forming a stiffener tape into a roll, wherein the stiffener tape includes a mounting tape, a metallic stiffener removably attached to the mounting tape and a die attach film attached to the metallic stiffener such that the metallic stiffener is between the mounting tape and the die attach film.

7. The method of claim 6, further comprising:
   unrolling the roll of stiffener tape; and
   attaching the stiffener tape to a wafer.

8. The method of claim 7, further comprising attaching a back-grind tape to the wafer before attaching the stiffener tape to the wafer.

9. The method of claim 8, further comprising thinning the wafer after attaching the back-grind tape to the wafer.

10. The method of claim 9, wherein attaching the stiffener ape to the wafer includes attaching the stiffener tape to the thinned wafer.

11. The method of claim 10, further comprising removing the back-grind tape from the thinned wafer.

12. The method of claim 7, further comprising singulating the wafer.

13. The method of claim 12, wherein singulating the wafer includes dicing the wafer with two cutting blades.

14. A method comprising:
   forming a stiffener tape that includes a mounting tape, a metallic stiffener removably attached to the mounting tape and a die attach film attached to the metallic stiffener, wherein the metallic stiffener is between the mounting tape and the die attach film; and
   attaching the stiffener tape to the wafer.

15. The method of claim 14, further comprising attaching a back-grind tape to the wafer before attaching the stiffener tape to the wafer.

16. The method of claim 14, further comprising:
   thinning the wafer after attaching the back-grind tape to the wafer;
   removing the back-grind tape from the thinned wafer; and
   singulating the wafer.

* * * * *